United States Patent
Cui et al.

(10) Patent No.: US 7,924,198 B2
(45) Date of Patent: Apr. 12, 2011

(54) DIGITAL-TO-ANALOG CONVERTER

(75) Inventors: Zhiyuan Cui, Chungcheongbuk-do (KR); Injae Chung, Gyeonggi-do (KR); Namsoo Kim, Chungcheonbuk-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/646,309

(22) Filed: Dec. 23, 2009

(65) Prior Publication Data

US 2010/0164777 A1 Jul. 1, 2010

(30) Foreign Application Priority Data

Dec. 26, 2008 (KR) .................. 10-2008-0134299
Dec. 7, 2009 (KR) .................. 10-2009-0120618

(51) Int. Cl.
*H03M 1/66* (2006.01)
(52) U.S. Cl. .................. 341/144; 341/135; 341/145
(58) Field of Classification Search .................. 341/135, 341/144, 145
See application file for complete search history.

(56) References Cited

U.S. PATENT DOCUMENTS

| | | | | |
|---|---|---|---|---|
| 4,408,190 A | * | 10/1983 | Nagano | 341/135 |
| 5,243,347 A | * | 9/1993 | Jackson et al. | 341/144 |
| 6,741,195 B1 | * | 5/2004 | Cho | 341/136 |
| 7,456,773 B1 | * | 11/2008 | Seo et al. | 341/145 |

* cited by examiner

*Primary Examiner* — Khai M Nguyen
(74) *Attorney, Agent, or Firm* — Morgan, Lewis & Bockius LLP

(57) ABSTRACT

A digital-to-analog converter is disclosed. The digital-to-analog converter includes a decoder that receives a plurality of digital input signals to output a plurality of thermometer decode signals, a current supply part including a plurality of current sources, each of which operates in one of a sleeping mode and an operating mode under the control of the thermometer decode signals, and a switching part including a plurality of switching units, each of which operates in one of a sleeping mode and an operating mode under the control of the thermometer decode signals. The current supply part selectively outputs a plurality of switching power signals. The switching part outputs an analog signal under the control of the thermometer decode signals.

17 Claims, 10 Drawing Sheets

DIGITAL-TO-ANALOG CONVERTER

This application claims the benefit of Korea Patent Application No. 10-2008-0134299 filed on Dec. 26, 2008 and Korea Patent Application No. 10-2009-0120618 filed on Dec. 7, 2009, the entire contents of which is incorporated herein by reference for all purposes as if fully set forth herein.

BACKGROUND OF THE INVENTION

1. Field of the Invention

Embodiments of the invention relate to a digital-to-analog converter.

2. Discussion of the Related Art

Most of information communication systems have operated based on digital signal process technology. On the contrary, because information humans hear and see is analog information, a digital signal has to be converted into an analog signal.

A digital-to-analog converter is used to convert a digital signal into an analog signal, for example, a digital type code signal into an analog voltage.

The digital-to-analog converter generally decodes an input digital signal to produce a plurality of control signals. The digital-to-analog converter includes a plurality of current sources receiving the plurality of control signals, and a plurality of switches that are respectively connected to the plurality of current sources to output an analog signal depending on the control signals. If the current sources receive the control signals, the current sources may always output a current. The switches may provide an analog output signal only when the switches receive activated control signals.

In case the current sources are analog circuits, such as a current mirror, power consumption of the digital-to-analog converter increases because all of the current mirrors are always driven and are ready to output the current. Accordingly, the power consumption of the digital-to-analog converter has to be reduced to be suitable for systems requiring low power consumption.

SUMMARY OF THE INVENTION

Embodiments of the invention provide a digital-to-analog converter capable of reducing power consumption.

In one aspect, there is a digital-to-analog converter comprising a decoder that receives a plurality of digital input signals to output a plurality of thermometer decode signals, a current supply part including a plurality of current sources, each of which operates in one of a sleeping mode and an operating mode under the control of the thermometer decode signals, the current supply part selectively outputting a plurality of switching power signals, and a switching part including a plurality of switching units, each of which operates in one of a sleeping mode and an operating mode under the control of the thermometer decode signals, the switching part outputting an analog signal under the control of the thermometer decode signals.

An i-th current source of the plurality of current sources operates in the operating mode when an output of an (i−1)-th current source and an i-th thermometer decode signal are activated, where "i" is a positive integer. The i-th current source is converted into the sleeping mode when at least one of the output of the (i−1)-th current source and the i-th thermometer decode signal are inactivated.

When the i-th current source is converted into the sleeping mode, an (i+1)-th current source cascade-connected to an output terminal of the i-th current source to a last current source and an i-th switching unit to a last switching unit of the plurality of switching units are converted into the sleeping mode.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
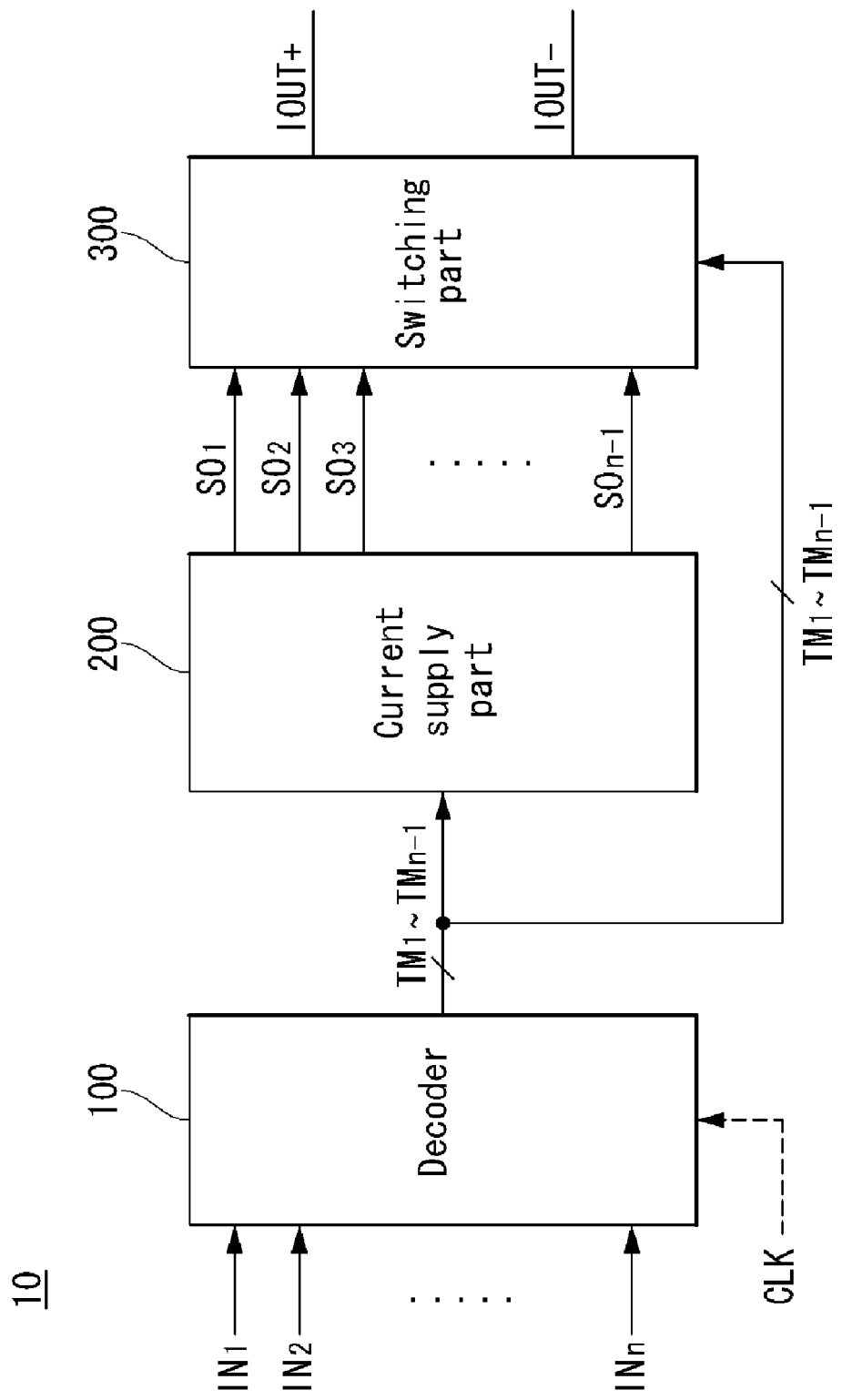
FIG. 1 is a block diagram of a digital-to-analog converter according to an embodiment of the invention.

The invention will be described more fully hereinafter with reference to the accompanying drawings, in which example embodiments of the inventions are shown. This invention may, however, be embodied in many different forms and should not be construed as limited to the embodiments set forth herein. Like reference numerals designate like elements throughout the specification. In the following description, if it is decided that the detailed description of known function or configuration related to the invention makes the subject matter of the invention unclear, the detailed description is omitted.

Names of elements used in the following description are selected in consideration of facility of specification preparation. Thus, the names of the elements may be different from names of elements used in a real product.

FIG. 1 is a block diagram of a digital-to-analog converter according to an embodiment of the invention.

As shown in FIG. 1, a digital-to-analog converter 10 according to an embodiment of the invention includes a decoder 100, a current supply part 200, and a switching part 300.

The decoder 100 receives n input signals $IN_1$ to $IN_n$ to output (n−1) thermometer decode signals $TM_1$ to $TM_{n-1}$, where n is a positive integer equal to or greater than 2. The thermometer decode signals $TM_1$ to $TM_{n-1}$ output from the decoder 100 are input to the current supply part 200 and the switching part 300.

FIGS. 2 to 5 are waveform diagrams illustrating an operation of the decoder 100. More specifically, FIGS. 2 to 5 illustrate an operation of the decoder 100 with respect to two input signals $IN_1$ and $IN_2$ among the n input signals $IN_1$ to $IN_n$ for convenience. Further, it is assumed that weight values of the first and second input signals $N_1$ and $IN_2$ are $2^0$ and $2^1$, respectively.

Figure 2:
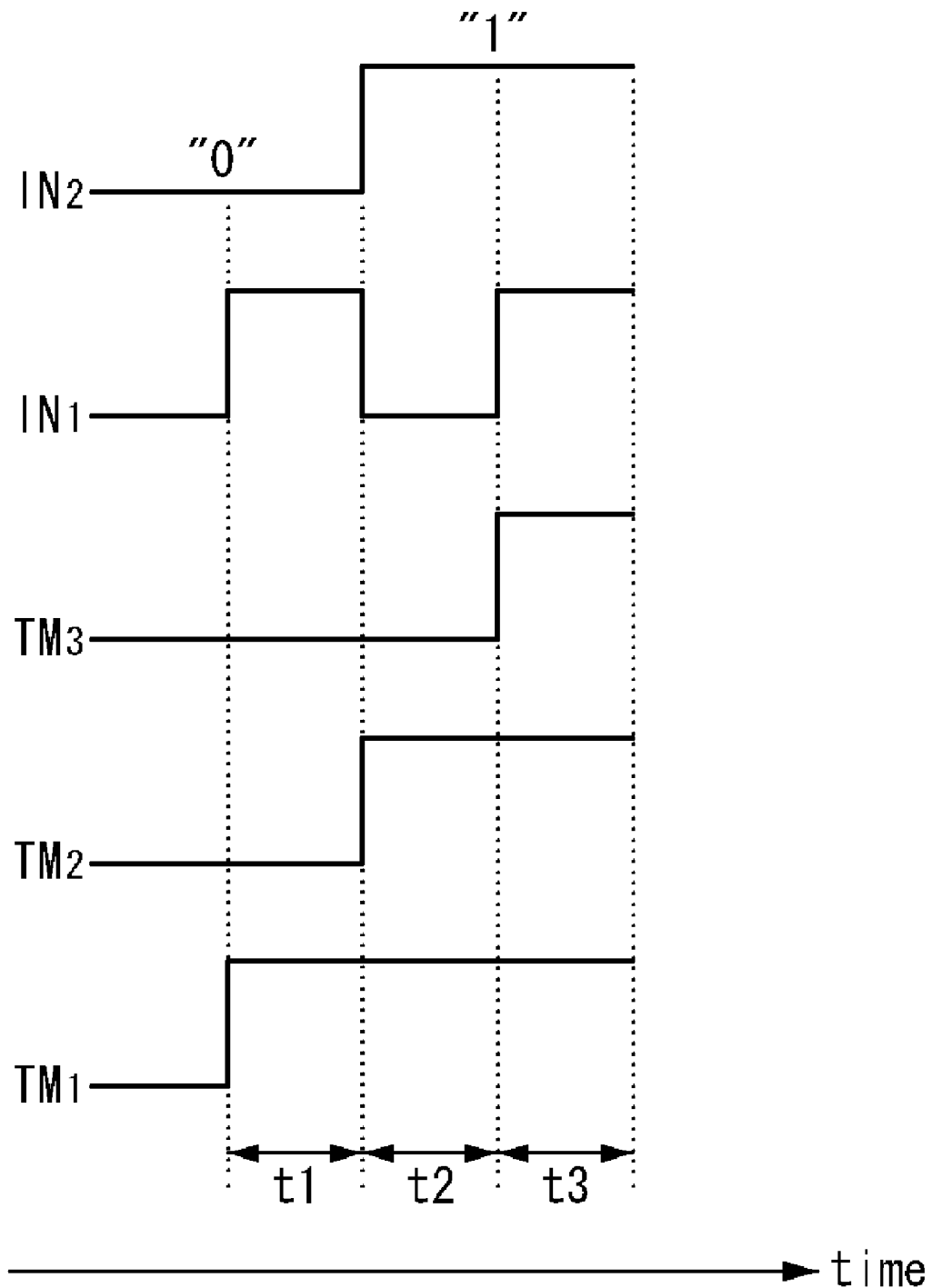
FIGS. 2 to 5 are waveform diagrams illustrating input and output operations of a decoder.
Figure 3:
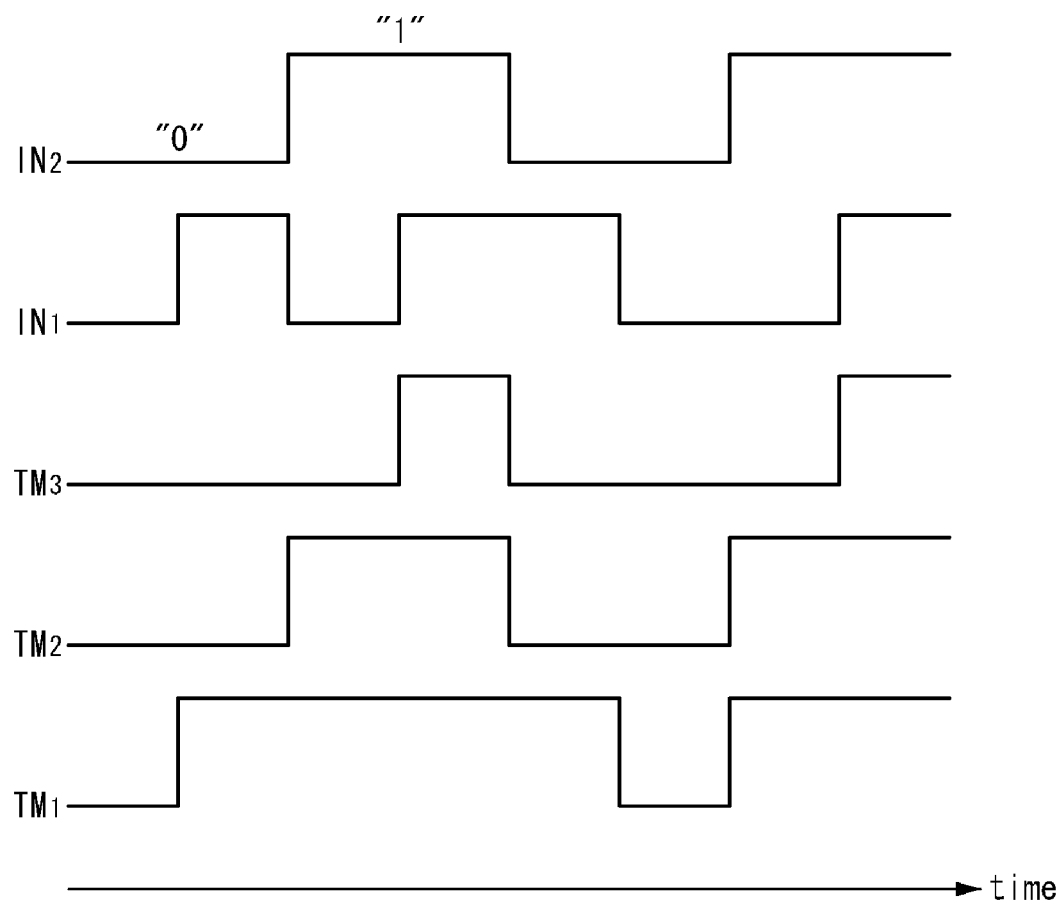

As shown in FIGS. 2 and 3, bits of the first and second input signals $IN_1$ and $IN_2$ are $01_2(=1)$ at a time point t1 and change to $10_2(=2)$ at a time point t2. Subsequently, bits of the first and second input signals $IN_1$ and $IN_2$ change to $11_2(=3)$ at a time point t3.

The decoder 100 activates least significant bit $TM_1$ of an output signal when a bit combination value of the first and second input signals $IN_1$ and $IN_2$ is '1' (at the time point t1). The decoder 100 activates two bits $TM_1$ and $TM_2$ including the least significant bit $TM_1$ of the output signal when the bit combination value of the first and second input signals $IN_1$ and $IN_2$ increases to '2' (at the time point t2). Subsequently, the decoder 100 activates three bits $TM_1$, $TM_2$, and $TM_3$ including the least significant bit $TM_1$ of the output signal when the bit combination value of the first and second input signals $IN_1$ and $IN_2$ increases to '3' (at the time point t3).

An output of the decoder 100 is obtained by changing only one bit of a previous output of the decoder 100. Every time a bit combination value of the digital input signals $IN_1$ to $IN_n$ changes by '1', the number of activated bits in the thermometer decode signals $TM_1$ to $TM_{n-1}$ output from the decoder 100 continuously increases. Thus, a combination of the number of activated bits in the thermometer decode signals $TM_1$ to $TM_{n-1}$ has continuity.

Figure 4:
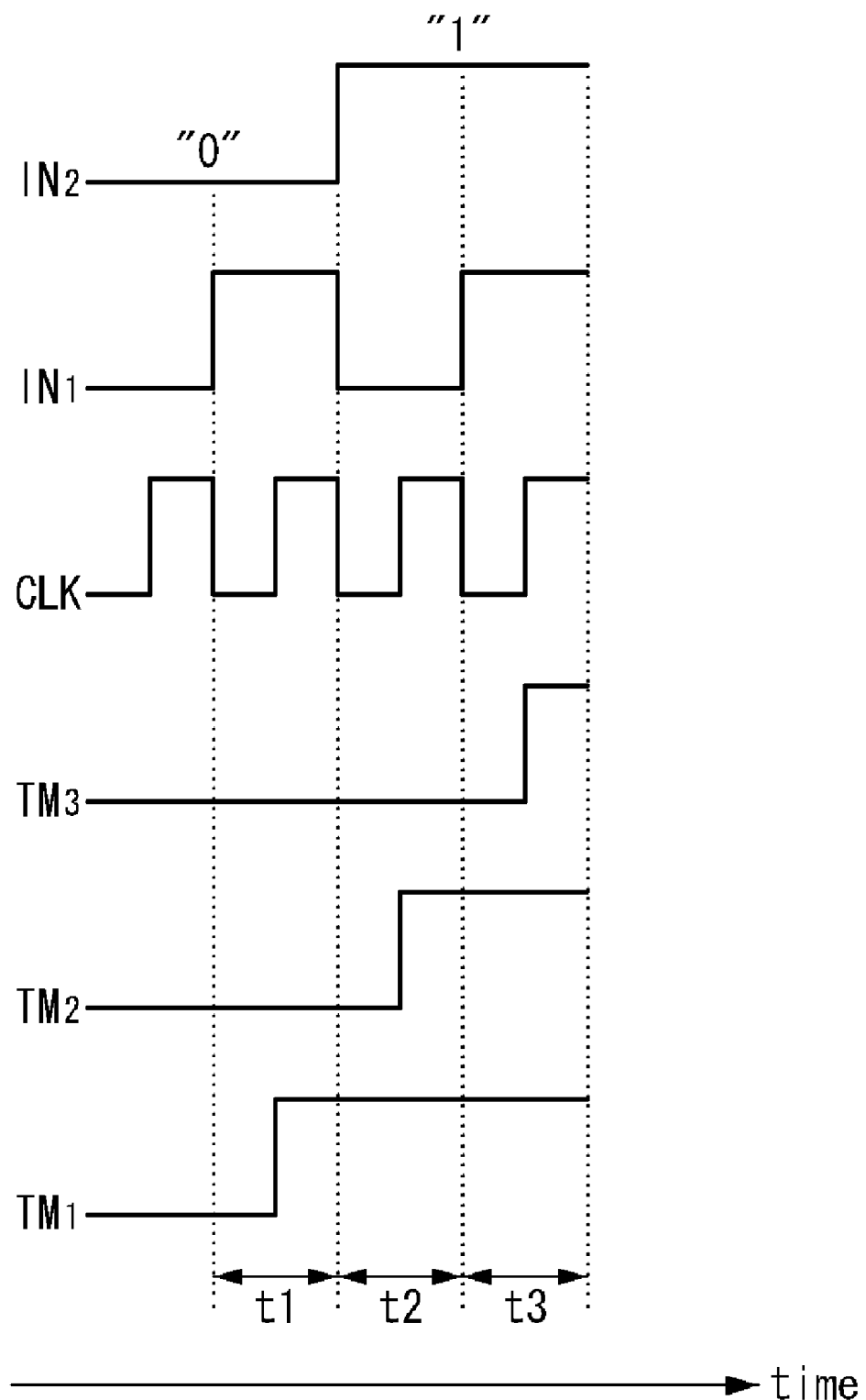
Figure 5:
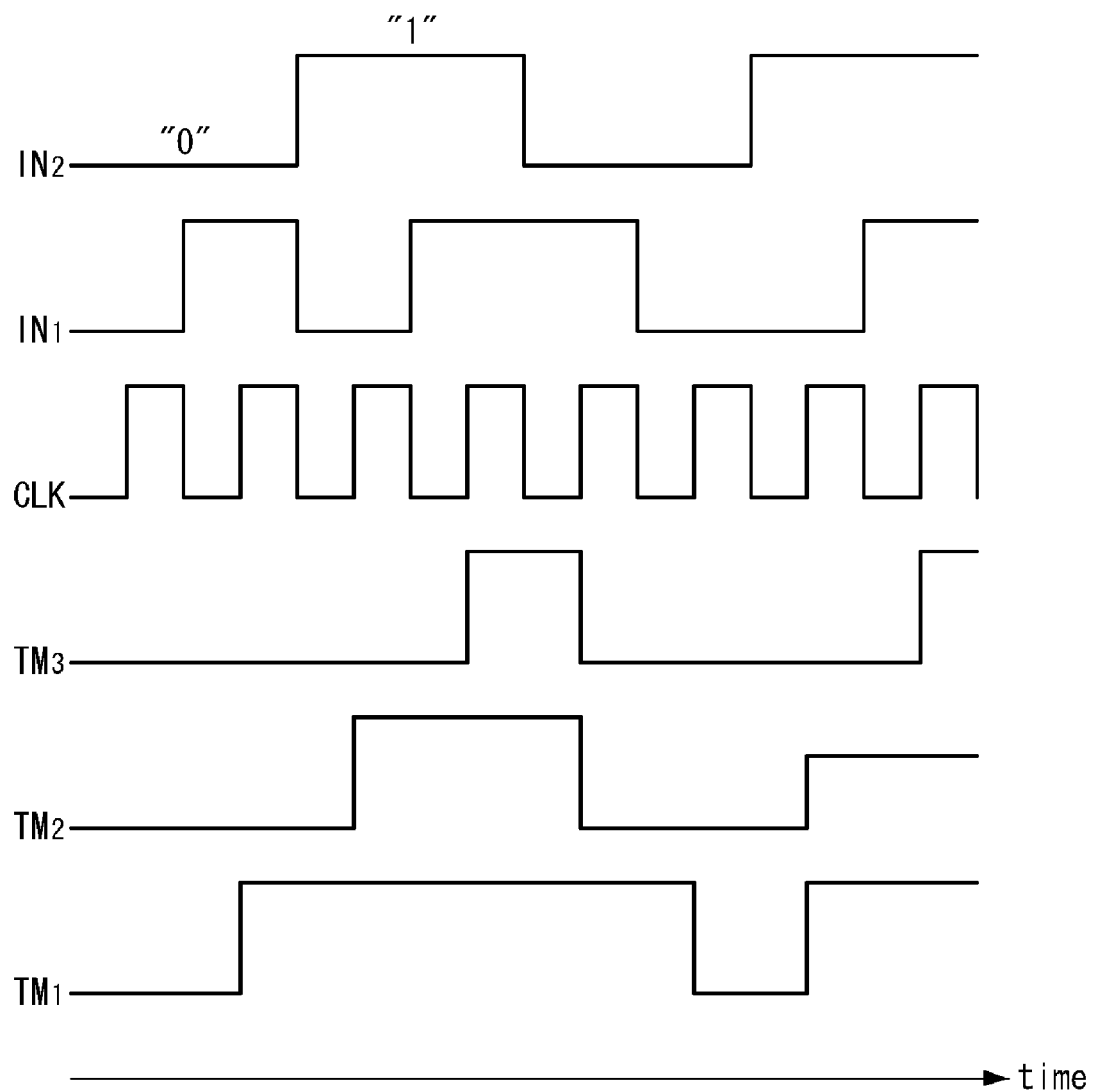

As shown in FIGS. 4 and 5, a clock CLK may be input to the decoder 100. Every time the bit combination value of the first and second input signals $N_1$ and $IN_2$ increases by '1', the decoder 100 increases the number of activated bits in the output signals $TM_1$ to $TM_3$ by '1' and sequentially activates the output signals $TM_1$ to $TM_3$ in response to the clock CLK. Even if the bit combination value of the first and second input signals $IN_1$ and $IN_2$ is equal to or greater than "1", the decoder 100 does not activate the output signals $TM_1$ to $TM_3$ when the clock CLK does not have an effective value of a high logic level. Thus, the decoder 100 activates the output signals $TM_1$ to $TM_3$ only when the bit combination value of the first and second input signals $IN_1$ and $IN_2$ is equal to or greater than "1" and the clock CLK has an effective value.

FIGS. 3 to 5 illustrate an example where the decoder 100 activates the output signals TM1 to TM3 when the clock CLK is activated. A reverse example may be applied to the embodiment. The decoder 100 can secure operation characteristics of a digital-to-analog converter circuit even in an input signal of a high speed.

The current supply part 200 includes a plurality of current sources each generating an output in response to the thermometer decode signals TM1 to TMn−1 to output a plurality of switch power signals $SO_1$ to $SO_{n-1}$. The plurality of current sources are selectively driven in response to the thermometer decode signals $TM_1$ to $TM_{n-1}$ to thereby minimize the power consumption of the digital-to-analog converter 10. For example, if the first to third thermometer decode signals $TM_1$ to $TM_3$ are activated, only three current sources receiving the activated first to third thermometer decode signals $TM_1$ to $TM_3$ are driven. While the current sources receiving the activated thermometer decode signals operate in an operating mode, the current sources receiving the inactivated thermometer decode signals wait in a sleeping mode.

The switching part 300 outputs analog signals IOUT+ and IOUT− in response to the thermometer decode signals $TM_1$ to $TM_{n-1}$ from the decoder 100 and the switch power signals $SO_1$ to $SO_{n-1}$ from the current supply part 200. The switching part 300 includes a plurality of switching units respectively corresponding to the thermometer decode signals $TM_1$ to $TM_{n-1}$. Among the plurality of switching units, only the switching units receiving the activated thermometer decode signals receive a current from the current supply part 200. Each of the analog signals IOUT+ and IOUT− is output as a sum of outputs of the switching units receiving the activated thermometer decode signals.

Figure 6:
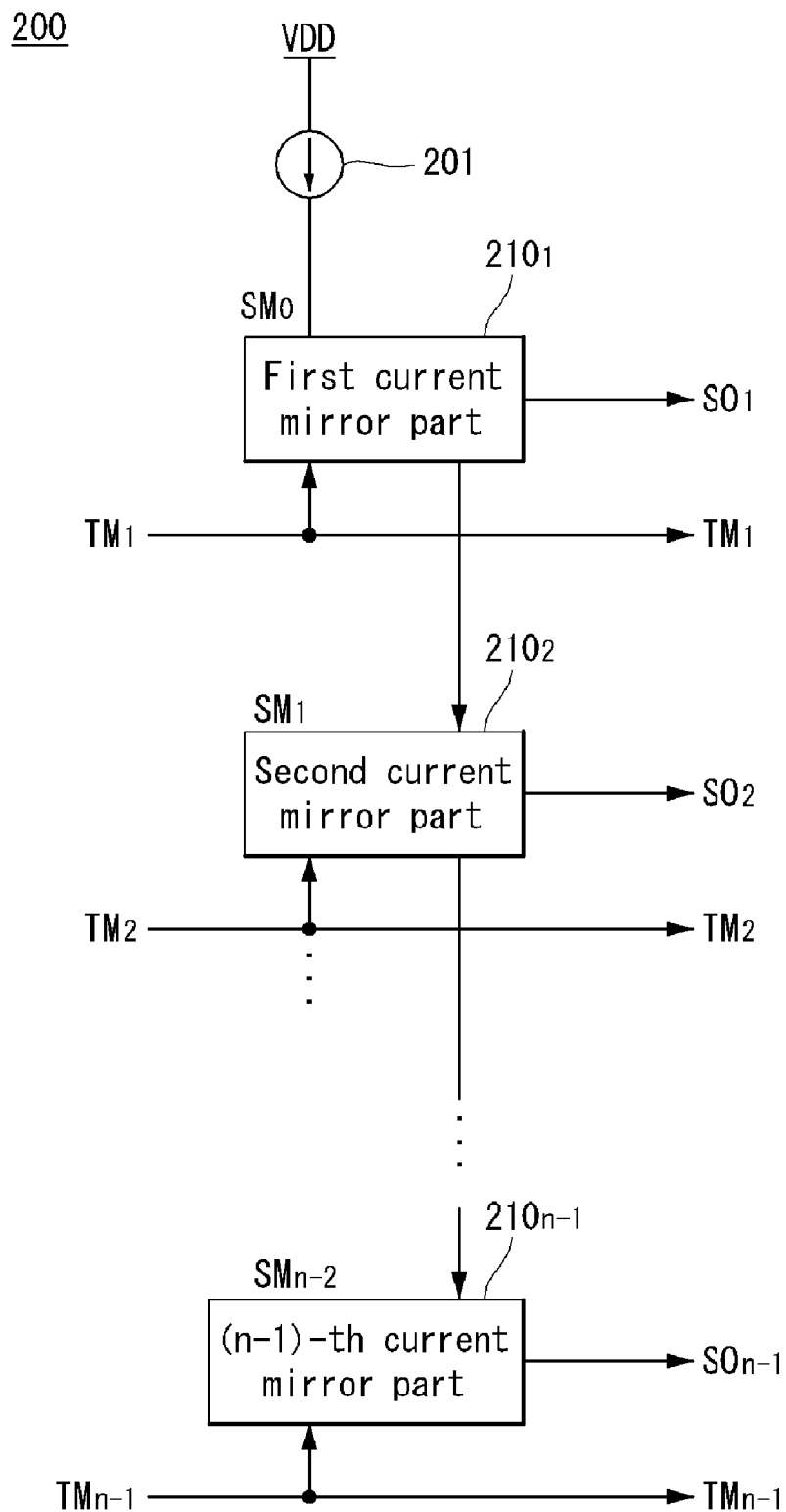
FIG. 6 is a block diagram illustrating in detail a current supply part.
Figure 7:
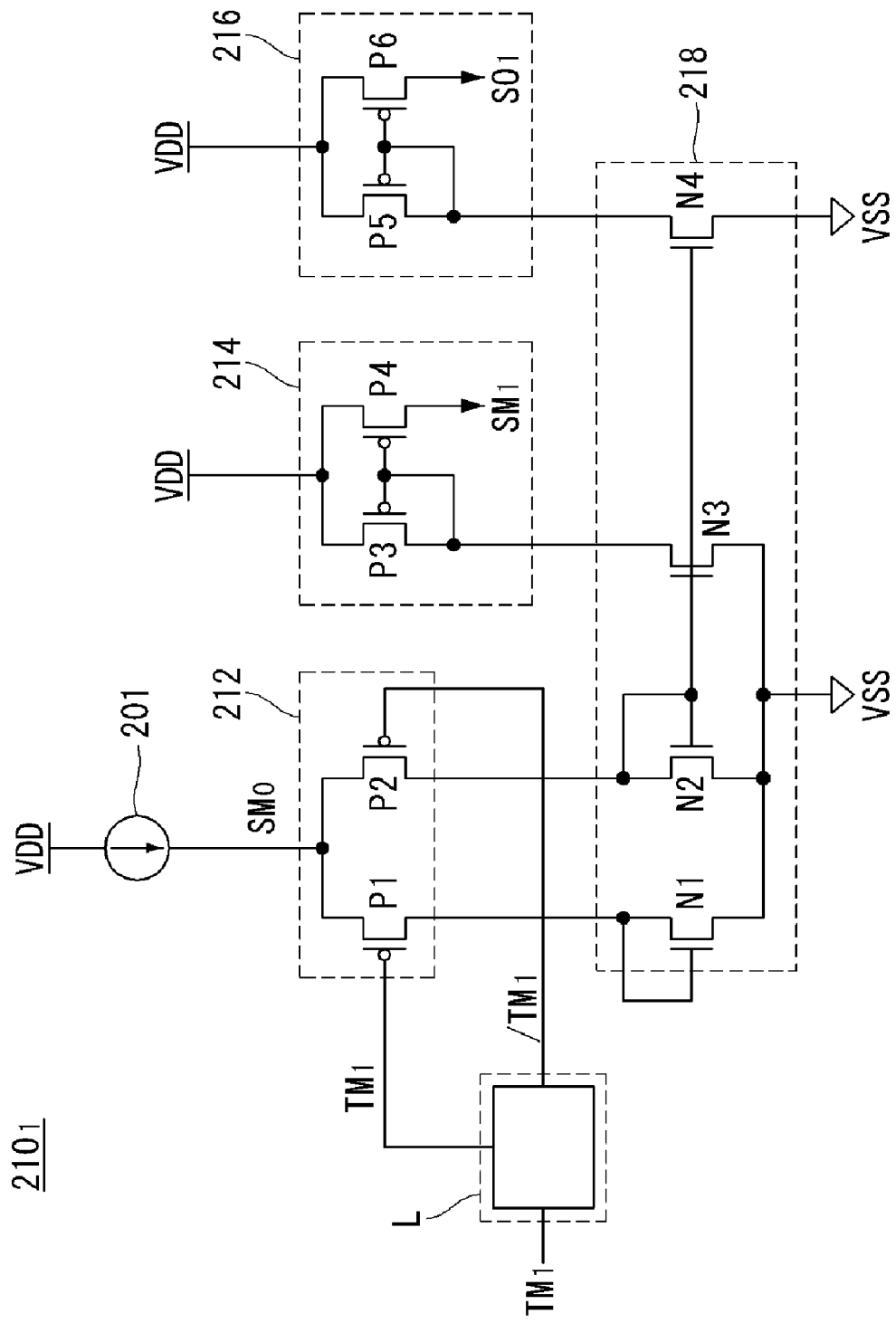
FIG. 7 is a circuit diagram illustrating in detail a first current mirror part.

FIGS. 6 and 7 are a block diagram and a circuit diagram illustrating in detail the current supply part 200, respectively.

As shown in FIG. 6, the current supply part 200 includes a plurality of current mirror parts $210_1$ to $210_{n-1}$. The current mirror parts $210_1$ to $210_{n-1}$ are cascade-connected to one another and are current sources selectively driven in response to the thermometer decode signals $TM_1$ to $TM_{n-1}$.

The first current mirror part $210_1$ receives a power current $SM_0$ from an external constant current source 201. The external constant current source 201 receives a high potential power voltage VDD to generate the power current $SM_0$. The first current mirror part $210_1$ is driven only when the activated first thermometer decode signal $TM_1$ is input to the first current mirror part $210_1$. Hence, the first current mirror part $210_1$ outputs a first current $SM_1$ to drive the second current mirror part $210_2$ and the first switch power signal $SO_1$ to drive a first switching unit ($310_1$ in FIG. 8) of the switching part 300.

The second current mirror part $210_2$ receives the first current $SM_1$ from the first current mirror part $210_1$ and is driven only when the activated second thermometer decode signal $TM_2$ is input to the second current mirror part $210_2$. Hence, the second current mirror part $210_2$ outputs a second current $SM_2$ to drive the third current mirror part $210_3$ and the second switch power signal $SO_2$ to drive a second switching unit ($310_2$ in FIG. 8) of the switching part 300.

Accordingly, the i-th current mirror part $210_i$ receives the (i−1)-th current $SM_{i-1}$ from the (i−1)-th current mirror part $210_{i-1}$ and generates an output only when the activated i-th thermometer decode signal $TM_i$ is input to the i-th current mirror part $210_i$, where i is a positive integer.

An operation or non-operation of a present current mirror part is determined depending on an operation or non-operation of a previous current mirror part because of a cascade-connection relationship between the current mirror parts $210_1$ to $210_{n-1}$. As described above, the thermometer decode signals $TM_1$ to $TM_{n-1}$ include successively activated bits. In the thermometer decode signals $TM_1$ to $TM_{n-1}$, all of remaining bits following a predetermined inactivated bit are inactivated. Thus, the embodiment of the invention blocks a flow of current between the current mirror parts receiving the remaining bits following the predetermined inactivated bit including the predetermined inactivated bit, thereby minimizing the power consumption of the digital-to-analog converter 10.

The detailed configuration and operation of the current mirror parts $210_1$ to $210_{n-1}$ are described in detail with reference to FIG. 7. FIG. 7 is a circuit diagram illustrating in detail the first current mirror part $210_1$. A circuit configuration of each of the current mirror parts $210_2$ to $210_{n-1}$ following the first current mirror part $210_1$ is substantially the same as the first current mirror part $210_1$.

As shown in FIG. 7, the first current mirror part $210_1$ includes a latch unit L, a receiving unit 212, first and second current mirror units 214 and 216, and a controller 218.

The latch unit L receives the first thermometer decode signal $TM_1$ to output a non-inverting first thermometer decode signal $TM_1$ and an inverting first thermometer decode signal $/TM_1$ to the receiving unit 212.

The receiving unit 212 includes first and second p-channel metal-oxide semiconductor (PMOS) transistors P1 and P2. The first and second PMOS transistors P1 and P2 are a pair of differential transistors that are turned of or off in response to the non-inverting first thermometer decode signal $TM_1$ and the inverting first thermometer decode signal $/TM_1$. The first PMOS transistor P1 supplies the power current $SM_0$ to the controller 218 in response to the non-inverting first thermometer decode signal $TM_1$. The first PMOS transistor P1 includes a source terminal receiving the power current $SM_0$, a gate terminal receiving the non-inverting first thermometer decode signal $TM_1$, and a drain terminal connected to a first n-channel MOS transistor N1 of the controller 218. The second PMOS transistor P2 supplies the power current $SM_0$ to the controller 218 in response to the inverting first thermometer decode signal $/TM_1$. The second PMOS transistor P2 includes a source terminal receiving the power current $SM_0$, a gate terminal receiving the inverting first thermometer decode signal $/TM_1$, and a drain terminal connected to a second NMOS transistor N2 of the controller 218.

A drive or non-drive of each of the first and second current mirror units 214 and 216 is determined depending on whether or not the receiving unit 212 generates an output by a current mirror operation of the controller 218.

The first current mirror unit 214 includes third and fourth PMOS transistors P3 and P4. When the second PMOS transistor P2 of the receiving unit 212 is turned on by the current mirror operation of the controller 218 (i.e., when the first thermometer decode signal $TM_1$ is activated), the third and fourth PMOS transistors P3 and P4 output the first current $SM_1$ which will drive the second current mirror unit 216. The third PMOS transistor P3 includes a source terminal receiving the high potential power voltage VDD, a drain terminal connected to a drain terminal of a third NMOS transistor N3 of the controller 218, and a gate terminal connected to the drain terminal of the third PMOS transistor P3. The fourth PMOS transistor P4 includes a source terminal receiving the high potential power voltage VDD, a drain terminal outputting the first current $SM_1$, and a gate terminal connected to the gate terminal of the third PMOS transistor P3.

The second current mirror unit 216 includes fifth and sixth PMOS transistors P5 and P6. When the second PMOS transistor P2 of the receiving unit 212 is turned on by the current mirror operation of the controller 218 (i.e., when the first thermometer decode signal $TM_1$ is activated), the fifth and sixth PMOS transistors P5 and P6 output the first switch power signal $SO_1$ which will drive the first switching unit ($310_1$ in FIG. 8) of the switching part 300. The fifth PMOS transistor P5 includes a source terminal receiving the high potential power voltage VDD, a drain terminal connected to a drain terminal of a fourth NMOS transistor N4 of the controller 218, and a gate terminal connected to the drain terminal of the fifth PMOS transistor P5. The sixth PMOS transistor P6 includes a source terminal receiving the high potential power voltage VDD, a drain terminal outputting the first switch power signal $SO_1$, and a gate terminal connected to the gate terminal of the fifth PMOS transistor P5.

As described above, the controller 218 includes the first to fourth NMOS transistors N1 to N4 and drives the first and second current mirror units 214 and 216 according to the current received from the receiving unit 212 through the current mirror operation of the controller 218.

A gate terminal and a drain terminal of the first NMOS transistor N1 are connected to each other. A source terminal of the first NMOS transistor N1 is connected to a low potential voltage source VSS. When the first PMOS transistor P1 is turned on (i.e., when the first thermometer decode signal $TM_1$ is inactivated), the first NMOS transistor N1 is turned on. In this case, the first NMOS transistor N1 operates as a diode and thus discharges a current of the first PMOS transistor P1 to the low potential voltage source VSS. When the first NMOS transistor N1 is turned on, the second NMOS transistor N2 is turned off. Thus, when the first NMOS transistor N1 is turned on, a current does not flow into the first and second current mirror units 214 and 216 because the current mirror operation of the controller 218 does not occur.

The second NMOS transistor N2, the PMOS transistors P3 to P6 of the first and second current mirror units 214 and 216, the third NMOS transistor N3, and the fourth NMOS transistor N4 form a current mirror circuit. A gate terminal and a drain terminal of the second NMOS transistor N2 are connected to each other. A source terminal of the second NMOS transistor N2 is connected to the low potential voltage source VSS. When the second PMOS transistor P2 is turned on (i.e., when the first thermometer decode signal TM1 is activated), the second NMOS transistor N2 is turned on. In this case, a current flows between the source terminal and the drain terminal of the second NMOS transistor N2, and at the same time, a current flows into the third and fourth NMOS transistors N3 and N4 because the third and fourth NMOS transistors N3 and N4 are turned on.

The third NMOS transistor N3 and the second NMOS transistor N2 form a current mirror circuit to thereby control the current flow of the first current mirror unit 214. When the third NMOS transistor N3 is turned on, a current flows between the source terminal and the drain terminal of each of the PMOS transistors P3 and P4 of the first current mirror unit 214. In the third NMOS transistor N3, a gate terminal is connected to the gate terminal of the second NMOS transistor N2, the drain terminal is connected to the drain terminal of the third PMOS transistor P3 of the first current mirror unit 214, and a source terminal is connected to the low potential voltage source VSS.

The fourth NMOS transistor N4 and the second NMOS transistor N2 form a current mirror circuit to thereby control the current flow of the second current mirror unit 216. When the fourth NMOS transistor N4 is turned on, a current flows between the source terminal and the drain terminal of each of the PMOS transistors P5 and P6 of the second current mirror unit 216. In the fourth NMOS transistor N4, a gate terminal is connected to the gate terminal of the second NMOS transistor N2, the drain terminal is connected to the drain terminal of the fifth PMOS transistor P5 of the second current mirror unit 216, and a source terminal is connected to the low potential voltage source VSS.

Because a large current $SM_i$ does not have to be supplied to the current mirror parts $210_1$ to $210_{n-1}$, it is preferable that the current $SM_i$ supplied to the current mirror parts $210_1$ to $210_{n-1}$ is equal to or less than $\frac{1}{10}$ of an input current of the switching part 300 so as to reduce the power consumption of the whole circuit. Thus, the sixth PMOS transistor P6 is formed as a transistor whose the size is greater than the fifth PMOS transistor P5. For example, a channel ratio of the sixth PMOS transistor P6 is about 10 times a channel ratio of the fifth PMOS transistor P5. The first to fourth NMOS transistors N1 to N4 have the same size (or the same channel ratio). Further, the third to fifth PMOS transistors P3 to P5 have the same size (or the same channel ratio). A relationship between the channel ratios of the PMOS transistors and a relationship between the channel ratios of the NMOS transistors are not limited to the above relationships. Other relationships may be applied.

The current supply unit 200 drives only the current mirror parts receiving the activated bits of the thermometer decode signal to output a current, which will drive a next-stage current mirror part following the current mirror parts receiving the activated bits, and the input current of the switching part 300. On the other hand, the current supply unit 200 controls the current mirror part receiving the inactivated bits of the thermometer decode signal in the sleeping mode and thus does not generate a current, which will drive next-stage current mirror parts following the current mirror part receiving the inactivated bits, and the input current of the switching part 300. In other words, while all of the pre-stage current mirror parts prior to the current mirror part receiving the inactivated bits of the thermometer decode signal operate in an operating mode, the next-stage current mirror parts following the current mirror part receiving the inactivated bits of the thermometer decode signal are controlled in the sleeping mode. The current does not flow to the current mirror parts of the sleeping mode. Accordingly, the power consumption of the digital-to-analog converter 10 is minimized.

Figure 8:
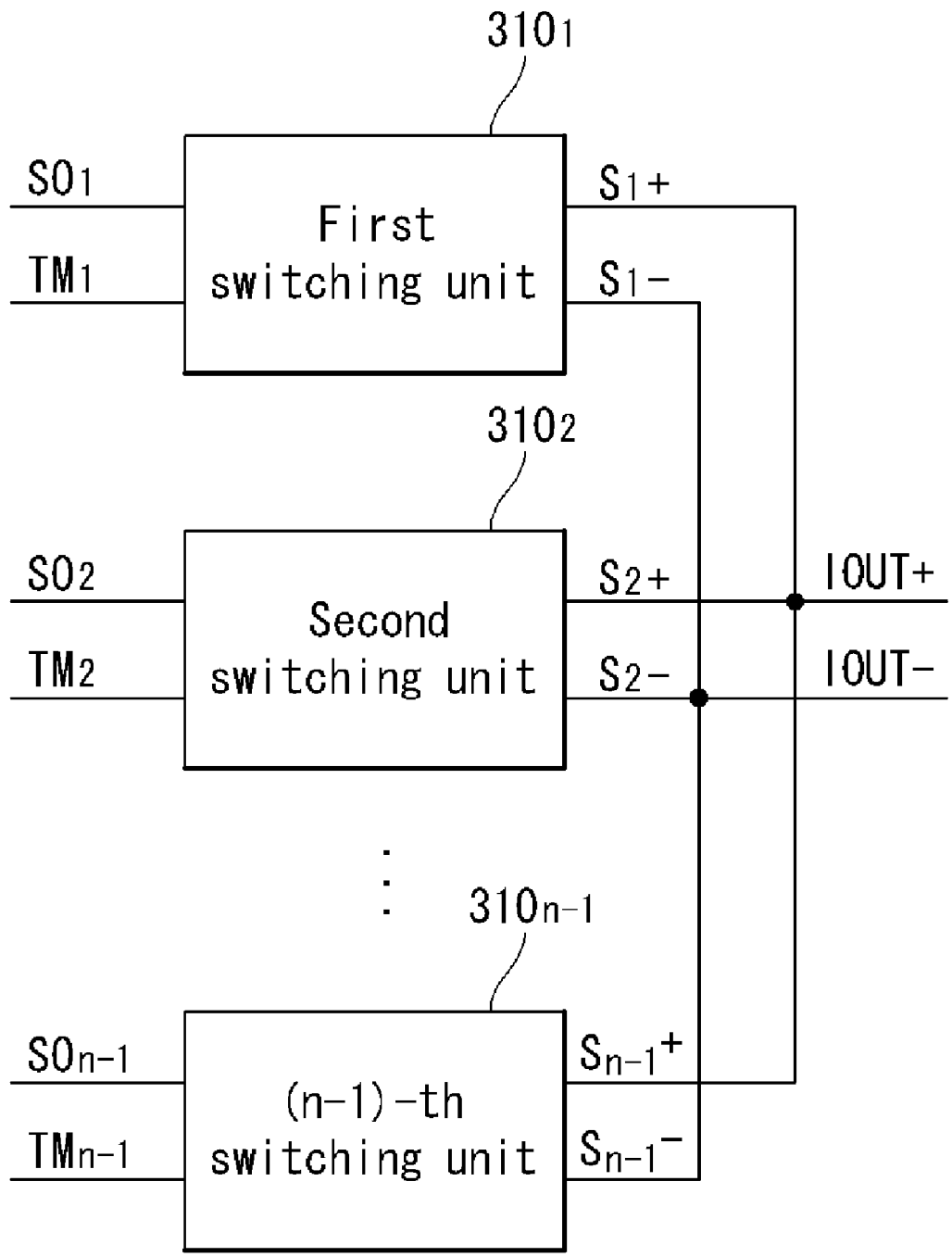
FIG. 8 is a block diagram illustrating in detail a switching part.
Figure 9:
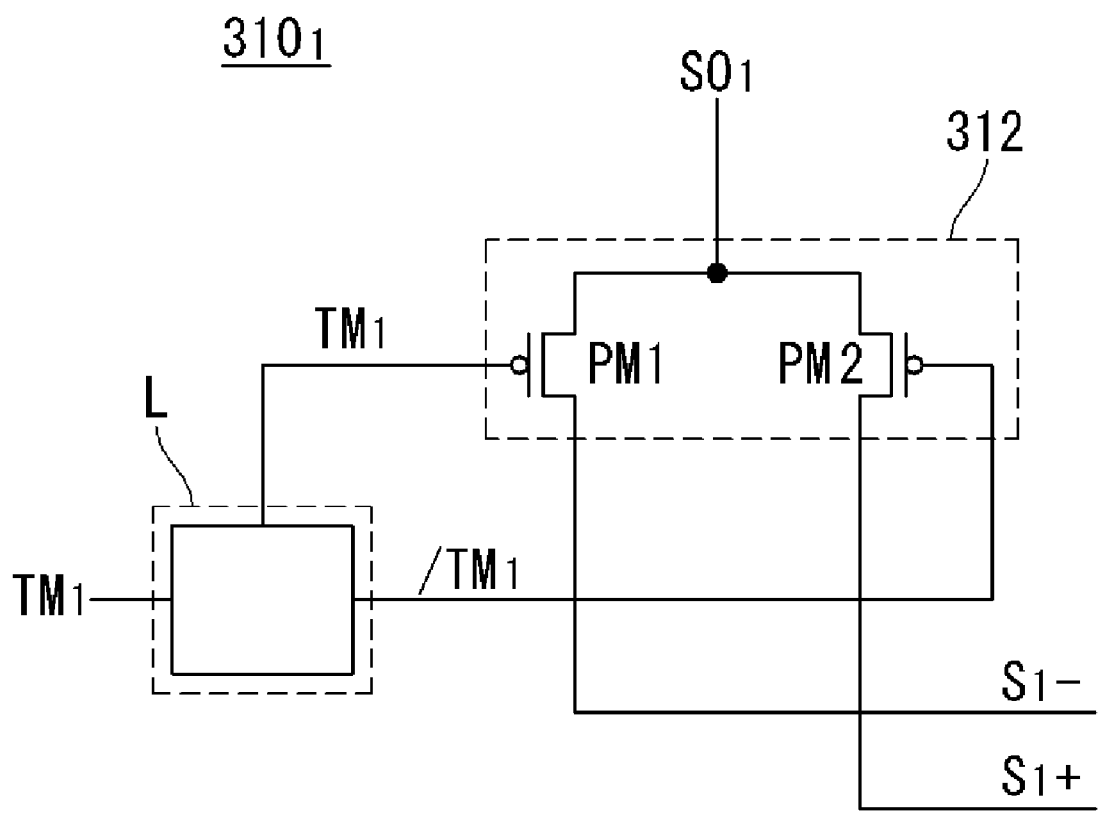
FIG. 9 is a circuit diagram illustrating in detail a first switching unit.

FIGS. 8 and 9 are a block diagram and a circuit diagram illustrating in detail the switching part 300, respectively.

As shown in FIG. 8, the switching part 300 includes a plurality of switching units $310_1$ to $310_{n-1}$.

The i-th switching unit $310_i$ receives the i-th thermometer decode signal $TM_i$ and the i-th switch power signal $SO_i$. The i-th switching unit $310_i$ outputs a positive current $S_i+$ and a negative current $S_i-$ only when the activated i-th thermometer decode signal $TM_i$ is input to the i-th switching unit $310_i$. The switching part 300 outputs a sum of positive currents $S_1+$ to $S_{n-1}+$ output from the switching units $310_1$ to $310_{n-1}$ as the analog signal IOUT+. Negative currents $S_1-$ to $S_{n-1}-$ are used as a dummy output for forming a current path and do not affect the analog signal IOUT+.

The detailed configuration and operation of the switching units $310_1$ to $310_{n-1}$ are described in detail with reference to FIG. 9. FIG. 9 is a circuit diagram illustrating in detail the first switching unit $310_1$. A circuit configuration of each of the switching units $310_2$ to $310_{n-1}$ following the first switching unit $310_1$ is substantially the same as the first switching unit $310_1$.

As shown in FIG. 9, the first switching unit $310_1$ includes a latch unit L and a differential receiving unit 312.

The latch unit L receives the first thermometer decode signal $TM_1$ and outputs the non-inverting first thermometer decode signal $TM_1$ and the inverting first thermometer decode signal $/TM1$ to the receiving unit 212 to drive the differential receiving unit 312.

The differential receiving unit 312 includes first and second PMOS transistors PM1 and PM2. The differential receiving unit 312 outputs the first positive current $S_1+$ and the first negative current $S_1-$ in response to the first thermometer decode signal $TM_1$.

The first PMOS transistor PM1 is turned on when the inactivated first thermometer decode signal $TM_1$ is input to the first PMOS transistor PM1. The first PMOS transistor PM1 includes a source terminal receiving the first switch power signal $SO_1$, a gate terminal receiving the non-inverting first thermometer decode signal $TM_1$, and a drain terminal outputting the first negative current S1−. If the inactivated first thermometer decode signal $TM_1$ is input to the first current mirror part $210_1$ of the current supply part 200, the first switch power signal $SO_1$ is not output. Thus, when the inactivated first thermometer decode signal $TM_1$ is input to the differential receiving unit 312, the first PMOS transistor PM1 is turned on. However, an output of the first PMOS transistor PM1 is hold at a ground level voltage.

The second PMOS transistor PM2 is turned on when the activated first thermometer decode signal $TM_1$ is input to the second PMOS transistor PM2. Hence, the second PMOS transistor PM2 outputs the first positive current $S_1+$. The second PMOS transistor PM2 includes a source terminal receiving the first switch power signal $SO_1$, a gate terminal receiving the inverting first thermometer decode signal $/TM_1$, and a drain terminal outputting the first positive current $S_1+$. If the activated first thermometer decode signal $TM_1$ is input to the first current mirror part $210_1$ of the current supply part 200, the first switch power signal $SO_1$ is output.

Figure 10:
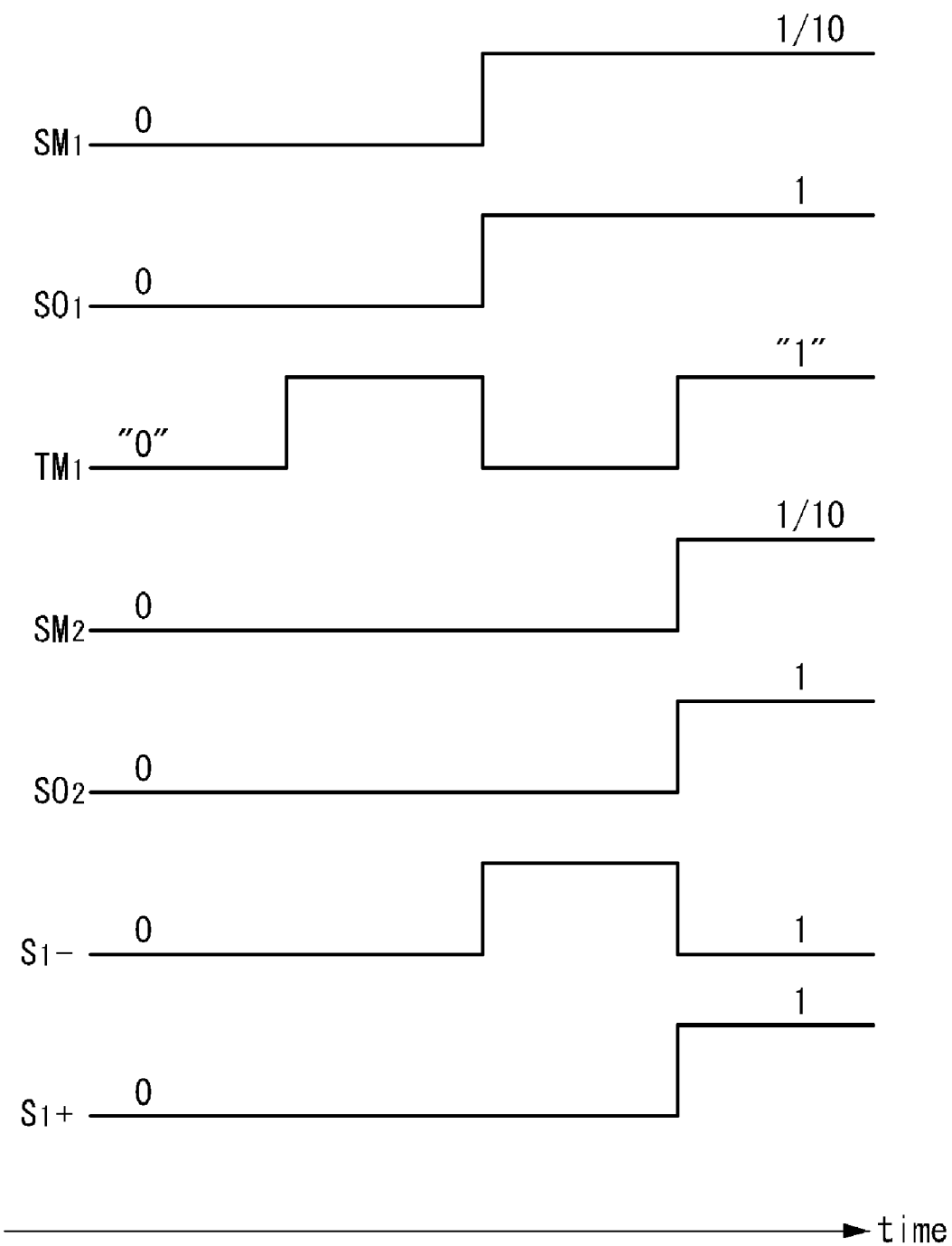
FIG. 10 is a waveform diagram illustrating input and output operations of a current supply part and a switching part.

FIG. 10 is a waveform diagram illustrating input and output operations of the current supply part 200 and the switching part 300.

As shown in FIG. 10, if each of the current mirror parts $210_1$ to $210_{n-1}$ does not receives current from the pre-stage current mirror part, each of the current mirror parts $210_1$ to $210_{n-1}$ remains in the sleeping mode. The currents $SM_1$ and $SM_2$, for example, output from the pre-stage current mirror parts control the operation of the next-stage current mirror parts and the operation of the next-stage switching units. In other words, if the currents $SM_1$ and $SM_2$ output from the pre-stage current mirror parts are not activated, the current to drive the next-stage current mirror parts and the current to be supplied to the next-stage switching units are not activated irrespective of a state of the thermometer decode signal $TM_1$. Hence, all of the next-stage current mirror parts and all of the next-stage switching units operate in the sleeping mode in which the current does not flow. On the contrary, if the currents $SM_1$ and $SM_2$ output from the pre-stage current mirror parts are activated, outputs of the next-stage current mirror parts are activated, and thus the current to be supplied to the next-stage switching units are activated. Hence, the next-stage current mirror parts and the next-stage switching units operate in the operating mode.

Further, although the embodiment of the invention illustrates the PMOS type current mirror parts and the PMOS type switching units for convenience, it is a matter of course that NMOS type current mirror parts and NMOS type switching units may be implemented.

As described above, in the digital-to-analog converter according to the embodiment of the invention, the power consumption may be minimized by converting a current source receiving the inactivated thermometer decode signal and current sources cascade-connected to an output terminal of the current source receiving the inactivated thermometer decode signal into a sleeping mode, and at the same time, by selectively converting the switching units into the sleeping mode depending on whether or not the current sources generate an output and whether the thermometer decode signal is activated or inactivated.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A digital-to-analog converter comprising:
   a decoder that receives a plurality of digital input signals to output a plurality of thermometer decode signals;
   a current supply part including a plurality of current sources, each of which operates in one of a sleeping mode and an operating mode under the control of the thermometer decode signals, the current supply part selectively outputting a plurality of switching power signals; and
   a switching part including a plurality of switching units, each of which operates in one of a sleeping mode and an operating mode under the control of the thermometer decode signals, the switching part outputting an analog signal under the control of the thermometer decode signals,
   wherein an i-th current source of the plurality of current sources operates in the operating mode when an output of an (i−1)-th current source and an i-th thermometer decode signal are activated, and the i-th current source is converted into the sleeping mode when at least one of the output of the (i−1)-th current source and the i-th thermometer decode signal are inactivated, where "i" is a positive integer, wherein when the i-th current source is converted into the sleeping mode, an (i+1)-th current source cascade-connected to an output terminal of the i-th current source to a last current source and an i-th switching unit to a last switching unit of the plurality of switching units are converted into the sleeping mode.

2. The digital-to-analog converter of claim 1, wherein the i-th current source outputs an input current of the (i+1)-th current source and an i-th switching power signal to be input to the i-th switching unit in the operating mode.

3. The digital-to-analog converter of claim 1, wherein the i-th switching unit does not output an input current of the (i+1)-th current source and an i-th switching power signal to be input to the i-th switching unit in the sleeping mode.

4. The digital-to-analog converter of claim 1, wherein the decoder continuously activates bits of the thermometer decode signals in successive order from a least significant bit.

5. The digital-to-analog converter of claim 1, wherein each of the plurality of current sources includes a current mirror circuit that generates an output through a current mirror operation only when the thermometer decode signal is activated.

6. The digital-to-analog converter of claim 1, wherein the i-th current source is converted into the sleeping mode and does not generate an output when a current is not output from the (i−1)-th current source or the i-th thermometer decode signal is inactivated.

7. The digital-to-analog converter of claim 1, wherein the i-th switching unit is converted into the sleeping mode and does not generate an output when an i-th switching power signal is not input to the i-th switching unit or the i-th thermometer decode signal is inactivated.

8. A digital-to-analog converter comprising:
a decoder that receives a plurality of digital input signals to output a plurality of thermometer decode signals;
a current supply part including a plurality of current sources, each of which operates in one of a sleeping mode and an operating mode under the control of the thermometer decode signals, the current supply part selectively outputting a plurality of switching power signals; and
a switching part including a plurality of switching units, each of which operates in one of a sleeping mode and an operating mode under the control of the thermometer decode signals, the switching part outputting an analog signal under the control of the thermometer decode signals,
wherein when an output of an (i−1)-th current source and an i-th thermometer decode signal are activated, an i-th current source operates in the operating mode to output an input current of an (i+1)-th current source and an i-th switching power signal to be input to an i-th switching unit, where "i" is a positive integer,
wherein when the i-th switching power signal and the i-th thermometer decode signal are activated, the i-th switching unit operates in the operating mode to output the analog signal.

9. The digital-to-analog converter of claim 8, wherein the decoder continuously activates bits of the thermometer decode signals in successive order from a least significant bit.

10. The digital-to-analog converter of claim 8, wherein each of the plurality of current sources includes a current mirror circuit that generates an output through a current mirror operation only when the thermometer decode signal is activated.

11. The digital-to-analog converter of claim 8, wherein the i-th current source is converted into the sleeping mode and does not generate an output when at least one of an output of the (i−1)-th current source and the i-th thermometer decode signal are inactivated.

12. The digital-to-analog converter of claim 8, wherein the i-th switching unit is converted into the sleeping mode and does not generate an output when at least one of the i-th switching power signal and the i-th thermometer decode signal are inactivated.

13. A digital-to-analog converter comprising:
a decoder that receives a plurality of digital input signals to output a plurality of thermometer decode signals;
a current supply part including a plurality of current sources, each of which operates in one of a sleeping mode and an operating mode under the control of the thermometer decode signals, the current supply part selectively outputting a plurality of switching power signals; and
a switching part including a plurality of switching units, each of which operates in one of a sleeping mode and an operating mode under the control of the thermometer decode signals, the switching part outputting an analog signal under the control of the thermometer decode signals,
wherein an i-th current source of the plurality of current sources operates in the operating mode when an output of an (i−1)-th current source and an i-th thermometer decode signal are activated, and the i-th current source is converted into the sleeping mode when at least one of the output of the (i−1)-th current source and the i-th thermometer decode signal are inactivated, where "i" is a positive integer,
wherein an i-th switching unit of the plurality of switching units operates in the operating mode when an i-th switching power signal and the i-th thermometer decode signal are activated, and the i-th switching unit is converted into the sleeping mode when at least one of the i-th switching power signal and the i-th thermometer decode signal are inactivated,
wherein when the i-th current source is converted into the sleeping mode, an (i+1)-th current source cascade-connected to an output terminal of the i-th current source to a last current source and the i-th switching unit to a last switching unit are converted into the sleeping mode.

14. The digital-to-analog converter of claim 13, wherein the decoder continuously activates bits of the thermometer decode signals in successive order from a least significant bit.

15. The digital-to-analog converter of claim 13, wherein each of the plurality of current sources includes a current mirror circuit that generates an output through a current mirror operation only when the thermometer decode signal is activated.

16. The digital-to-analog converter of claim 13, wherein each of the plurality of current sources does not generate an output in the sleeping mode.

17. The digital-to-analog converter of claim 13, wherein each of the plurality of switching units does not generate an output in the sleeping mode.

* * * * *